United States Patent [19]
Abbiate et al.

[11] Patent Number: 5,220,327
[45] Date of Patent: Jun. 15, 1993

[54] DECIMATION FILTER IN A SIGMA-DELTA ANALOG-TO-DIGTAL CONVERTER

[75] Inventors: Jean-Claude Abbiate, La Gaude; Alain Blanc, Vence; Patrick Jeanniot, La Gaude; Gerard Orengo, Biot; Gerard Richter, Nice, all of France

[73] Assignee: International Business Machines Corporation, Armonk, N.Y.

[21] Appl. No.: 878,106

[22] Filed: May 4, 1992

[30] Foreign Application Priority Data

Jul. 17, 1991 [EP] European Pat. Off. ........... 91480114

[51] Int. Cl.⁵ ............................................. H03M 3/02
[52] U.S. Cl. .................................. 341/143; 364/724.1
[58] Field of Search .................... 341/143; 364/724.04, 364/724.1

[56] References Cited

U.S. PATENT DOCUMENTS

| | | | |
|---|---|---|---|
| 4,775,851 | 10/1988 | Borth | 341/155 |
| 4,972,360 | 11/1990 | Cukier et al. | 364/724.04 |
| 5,027,306 | 6/1991 | Dattorro et al. | 364/724.1 |
| 5,126,961 | 6/1992 | Garverick | 364/724.1 |

FOREIGN PATENT DOCUMENTS 0356598 3/1990 European Pat. Off. .

OTHER PUBLICATIONS

ICASSP 85, IEEE International Conference on Acoustics, Speech, and Signal Processing, Mar. 26-29, 1985, IEEE New York US, pp. 36.2.1-36.2.4; Hanafy Meleis et al: "A Novel Architecture Design for VLSI Implementation or and FIR Decimation Filter".

IEEE Journal on Selected Areas in Communication, vol. 6, No. 3, Apr. 1988, New York, pp. 520-526; Vladimir Friedman et al: "A Bit-Slice Architecture for Sigma-Delta Analog-to-Digital Converters".

Primary Examiner—Marc S. Hoff
Attorney, Agent, or Firm—Edward H. Duffield

[57] ABSTRACT

A decimation filter for converting a train of sigma-delta pulses $S(i)$ in synchronism with a sigma-delta clock (fs) into a train of PCM samples which includes counters (321, 331, 341) driven by the sigma-delta clock (fs) and which is continuously incremented by one during N sigma-delta clock pulses, then decremented by two during N following sigma-delta clock pulses and then incremented again by one during N following sigma-delta clock pulses in order to provide a sequence of incrementation parameter DELTA(n). The decimation filter further includes storages (320, 330, 340) for storing the value of the coefficient $C(n)$ corresponding to the decimation filter transfer function, and incrementers (327, 337, 347) driven by the sigma-delta clock fs for incrementing the storages with the incrementation parameter DELTA(n). Finally, the decimation filter includes computers (323, 333, 343, 327, 337, 347) for deriving from the contents $C(n)$ of said storages and from the train of input sigma-delta samples $S(i+n)$ one Pulse Code Modulation (PCM) sample every $3 \times N$ input sigma-delta samples according to the formula:

$$\sum_{n=0}^{3N-1} C_n S_{i+n}$$

8 Claims, 9 Drawing Sheets

| Fb \ Fs | 10K | 50K | 100K | 200K | 500K | 1M | 2M | 5M | 10M |
|---|---|---|---|---|---|---|---|---|---|
| 100Hz | 72 | 104 | | | | | | | |
| 200Hz | 59 | 90 | 104 | | | | | | |
| 500Hz | 37 | 72 | 85 | 100 | | | | | |
| 1K | 22 | 57 | 72 | 85 | 104 | | | | |
| 3K | | 35 | 50 | 64 | 83 | 88 | 109 | | |
| 10K | | | 22 | 37 | 59 | 72 | 85 | 104 | |
| 20K | | | | 22 | 40 | 59 | 72 | 90 | 104 |
| 40K | | | | | 24 | 40 | 58 | 75 | 89 |
| 72K | | | | | | 30 | 45 | 65 | 78 |
| 100K | | | | | | 22 | 37 | 59 | 72 |

FIG. 3

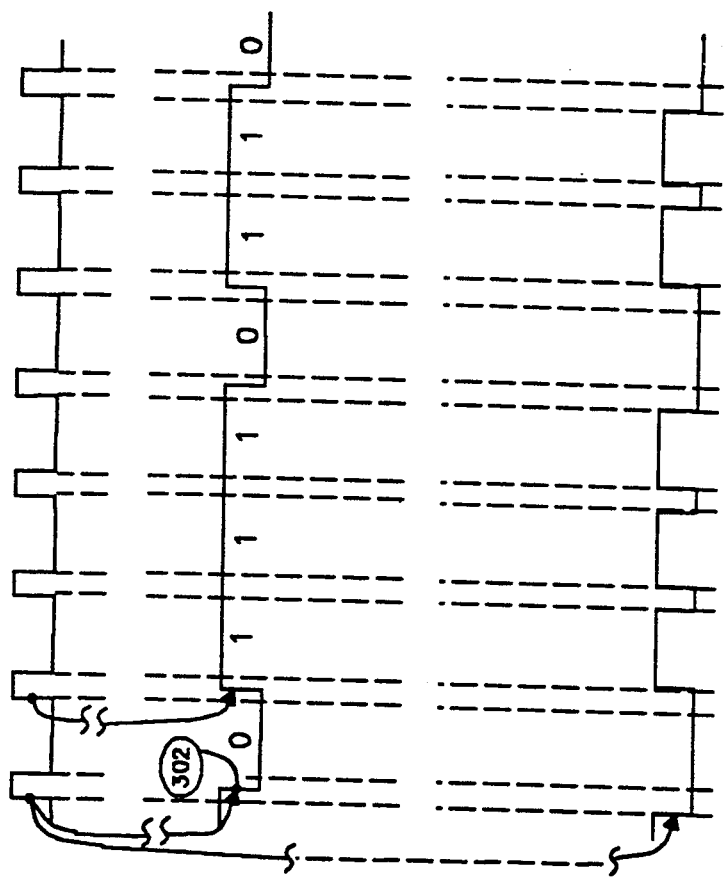

DECIMATION FILTER IN A SIGMA-DELTA ANALOG-TO-DIGTAL CONVERTER

TECHNICAL FIELD

The present invention relates generally to digital decimation and filtering devices and more particularly to a decimation filter for converting a train of sigma-delta pulses into a corresponding train of Pulse Code Modulation samples.

BACKGROUND ART

The sigma-delta technology is of great interest for realizing linear, accurate and simple analog-to-digital converters. Sigma-delta coders and decoders generally require the use of decimation circuits requiring a great number of electronic components. For that reason, decimation circuits are embodied by means of Very Large Scale Technology (VLSI) components.

FIG. 1 shows the traditional basic structure of a analog-to-digital converter using a sigma-delta converter (101) for converting an analog input signal existing on lead 110 into a train of sigma-delta pulses on a lead 120. The train of sigma-delta pulse comprises a high level of out-of-band quantization noise which is then entered into a decimation circuit 104 in order to convert the sigma-delta pulses into a sequence of Pulse Code Modulation (PCM) samples on lead 140. For that purpose, decimation circuit 104 includes a low-pass digital filter 102 for suppressing the above out-of-band quantization noise and for avoiding in-band aliasing during the decimation process. Decimation circuit 104 also includes a specific decimation element which samples down the output signal of the low-pass filter. This is simply achieved by taking one sample over N samples. N is called the "decimation factor" of the decimation process.

FIG. 2 illustrates the different signal spectra which are involved in sigma-delta conversion and decimation processes. FIG. 2a shows a spectrum of a typical band-limited analog input signal which is carried by lead 110 and which is to be coded. FIG. 2b shows the spectrum of the corresponding train of sigma-delta pulses existing on lead 120 and resulting from the sigma-delta conversion process. As mentioned above, the sigma-delta bit stream has a high level of out-of-band quantization noise which periodically extends over the whole band with a period fs which is equal to the value of the sigma-delta modulation frequency. The dotted lines in FIG. 2c illustrate the frequency response of the low-pass filter. The resulting filtered signal has a spectrum which is shown in FIG. 2d. Finally, FIG. 2e illustrates the spectrum of the PCM signal which exists at the output of decimation circuit 104. The PCM words are generated at a frequency of fs/N.

Generally speaking, the value of the decimation factor N is chosen by considering first the signal/noise ratio which is required and also the bandwidth of the input signal. Since sigma-delta coders and decoders are likely to be used in a wide variety of different applications, it is highly desirable to provide a sigma-delta coder having a variable, programmable decimation factor as will be shown in the following examples which have been chosen in the telecommunication field. A first example can be found by considering a V32 modem or DCE. The echo estimation and cancellation techniques involved in such modems require a signal-to-noise ratio which is at least equal to 80 dB. FIG. 3 shows a table indicating approximate theoretical values of the signal-to-noise ratio as a function of the bandwidth of the input signal fb and also the oversampling frequency fs. It appears in the table that a signal-to-noise ratio of 80 dB is provided in the case where the ratio fs/fb (i.e., the "oversampling factor") is at least equal to 300. Since the bandwidth of such modems is about 3 kHz, the oversampling frequency must be at least equal to 900 khz. If the V32 modem uses four samples per bit time, the decimation factor appears to be equal to 300/4=75. Conversely, when considering a base-band modem which is intended to be connected to a digital network, the bandwidth should be at least equal to 72 kHz. It results that the preceding oversampling ratio (300) would lead to an oversampling frequency of at least 20 MHz (300×72 kHz) which is practically unattainable. However, since such a base-band modem does not involve highly sophisticated echo-cancellation techniques, a signal-to-noise ratio of 60 dB appears to be sufficient. FIG. 3 shows that a signal-to-noise ratio of 60 dB corresponds to an oversampling ratio of at least 64 which results in a decimation factor of 64/2=32 (assuming that the modem is embodied with a sigma-delta coder using two samples per bit time).

Therefore, since the oversampling frequency is compelled to be limited by the actual technology and since the value fb is likely to vary to a large extent when considering different applications (modems, voice processing system, audio etc . . . ) it is highly desirable to provide a sigma-delta coder which has a decimation factor that is variable and adjustable by the user. Since the sigma-delta converter is intended to be embodied in costly high sophisticated VLSI technology, it is also desirable that the same chip be able to satisfy a wide variety of users.

OBJECTS OF INVENTION

The problem to be solved by the present invention is to provide an improved decimation filter and an analog-to-digital converter having a decimation filter with which it is possible to simply vary the decimation factor N without requiring the use of complex tables in which are stored the different coefficients of the decimation filter for any value of the decimation factor.

BRIEF SUMMARY OF INVENTION

This problem is solved by a decimation filter for converting a train of sigma-delta pulses S(i) in synchronism with a sigma-delta clock into a train of PCM samples in accordance with the present invention. The decimation filter has computing means including counting means which is driven by the sigma-delta clock and continuously incremented by one during N sigma-delta clock pulses, then decremented by two during N following sigma-delta clock pulses and then incremented again by one during N following sigma-delta clock pulses in order to provide a sequence of incrementation parameter DELTA(n). The computing means further includes storing means for storing the value of the coefficient C(n) corresponding to the decimation filter transfer function, and means driven by the sigma-delta clock for incrementing the storing means with the incrementation parameter DELTA(n). Finally, the computing means includes means for deriving from the contents C(n) of said storing means and from the train of input sigma-delta samples S(i+n) one Pulse Code Modulation (PCM) sample every $3 \times N$ input sigma-delta samples according to the formula:

$$\sum_{n=0}^{3N-1} C_n S_{i+n}$$

Since the coefficients C(n) are directly computed on-line with the reception of the sigma-delta pulses, the decimation filter can operate for any value of the decimation parameter without requiring the use of further substantial digital processing resources. The decimation filter according to the present invention, which can be embodied in one Very Large Scale Integrated chip, can be used for a wide variety of different applications requiring different decimation factors.

In a preferred embodiment of the invention, the decimation filter includes three computing means respectively driven by a set of three phase-delayed clocks derived from said sigma-delta clock, each of said computing means computing one PCM sample from a sequence of $3 \times N$ consecutive input sigma-delta pulses. Therefore, the filter only requires the provision of the PCM clock, the sigma-delta clock and the train of sigma-delta pulses to provide a multipurpose decimation process.

In a more preferred embodiment of the invention, each of the three computing means includes counting means having a control lead and performing an incrementation by one when said control lead is at a first logical level and conversely for performing a decrementation by two when said control lead is at a second logical level. Each of the three computing means further includes a first register for storing the value C(n) of the coefficient to be multiplied by the next sigma-delta input sample S(i+n), adding means active every sigma-delta clock period for adding the contents of said counting means with the contents of said first register in order to compute the following coefficient C(n+1) to be loaded into said first register. Each computing means further includes multiplying means which is connected to said first register and which receives the train of sigma-delta pulses for computing at every period of the sigma-delta clock (fs) the product $C(n) \times S(i+n)$, and a second register which is continuously incremented by the result of said multiplying means.

BRIEF DESCRIPTION OF THE DRAWINGS

FIG. 3 is a table showing the variation of the signal-to-noise ratio with the frequency of the input signal fb and the oversampling frequency fs.

FIGS. 9a, 9b and 9c are timing diagrams showing the operating of the double-loop sigma-delta converter.

DESCRIPTION OF THE PREFERRED EMBODIMENT OF THE INVENTION

Figure 1:
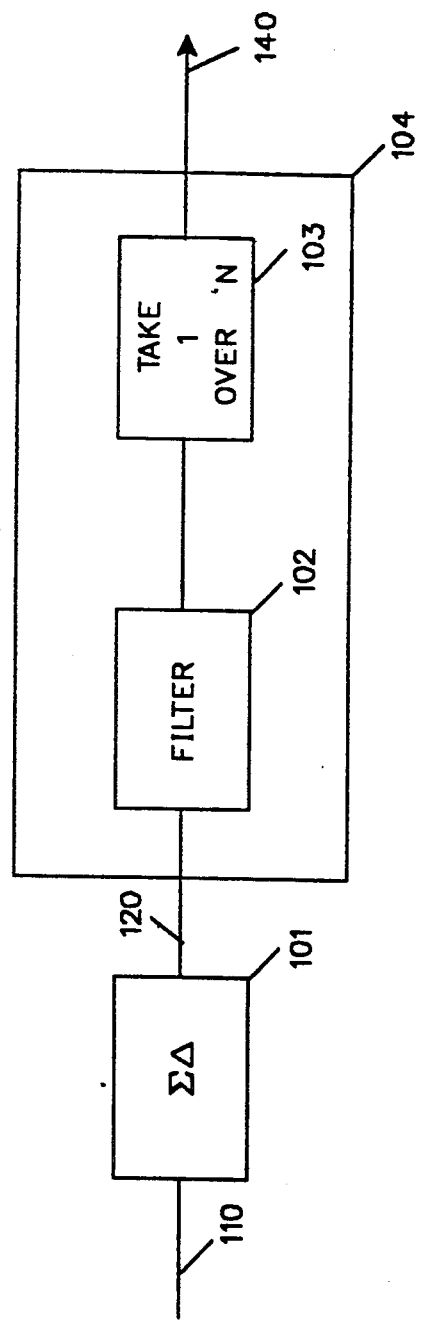
FIG. 1 shows the basic structure of a prior art sigma-delta converter using a decimation filter.

The decimation and filter circuit in accordance with the present invention simultaneously performs the filtering and decimation function by computing one filtered output over N samples in accordance with the following transfer function:

$$H(f) = \left( \frac{\sin\left(\frac{N\pi f}{fs}\right)}{N \sin\left(\frac{\pi f}{fs}\right)} \right)^3$$

which is particularly well suited for decimation purposes. The coefficients of the digital filter results from the Z transfer function:

$$H(Z) = \left( \frac{1 - Z^{-N}}{1 - Z^{-1}} \right)^3 \quad \text{(relation 1)}$$

$$= (1 + Z^{-1} + \ldots + Z^{-(N-1)})^3$$

$$= C_0 + C_1 Z^{-1} + \ldots + C_{(3N-3)} Z^{-(3N-3)}$$

The computation of one PCM sample by the digital processing system included in the apparatus according to the present invention is performed with a set of 3N consecutive input samples S(i). The PCM output sample is equal to $$\sum_{n=0}^{3N-1} C_n S_{i+n} \quad \text{(relation 2)}$$

The coefficients used for the computation are given by the following formulas deriving from the above relationship (2):

For $n = 0 \ldots N - 1$ (W0 Window)

$$C_n = n \frac{(n+1)}{2}$$

For $n = N \ldots 2N - 1$ (W1 Window)

$$C_n = N \frac{(N+1)}{2} + (n - N)(2N - 1 - n)$$

For $n = 2N \ldots 3N - 1$ (W2 Window)

$$C_n = (3N - n - 1) \frac{(3N - n)}{2}$$

Let us call $$C_{i+1} = C_i + \Delta_i$$

$$\Delta_{i+1} = \Delta_i + \delta_i$$

The following relations can be written:

for $n = 0 \ldots N - 1$ $$C_n = n \frac{(n+1)}{2}$$

-continued $$C_{n+1} = (n+1)\frac{(n+2)}{2}$$

$\Delta_n = n + 1$
$\delta_n = +1$
for $n = N \ldots 2 \times N - 1$ $$C_n = N\frac{(N+1)}{2} + (n-N)(2N - 1 - n)$$

$$C_{n+1} = N\frac{(N+1)}{2} + (n + 1 - N)(2N - n - 2)$$

$\Delta_n = 3N - 2n - 2$
$\delta_n = -2$
for $n = 2 \times N \ldots 3 \times N - 1$ $$C_n = (3N - n - 1)\frac{(3N - n)}{2}$$

$$C_{n+1} = (3N - n - 2)\frac{(3N - n - 1)}{2}$$

$\Delta_n = -3N + n + 1$
$\delta_n = +1$

Figure 4:
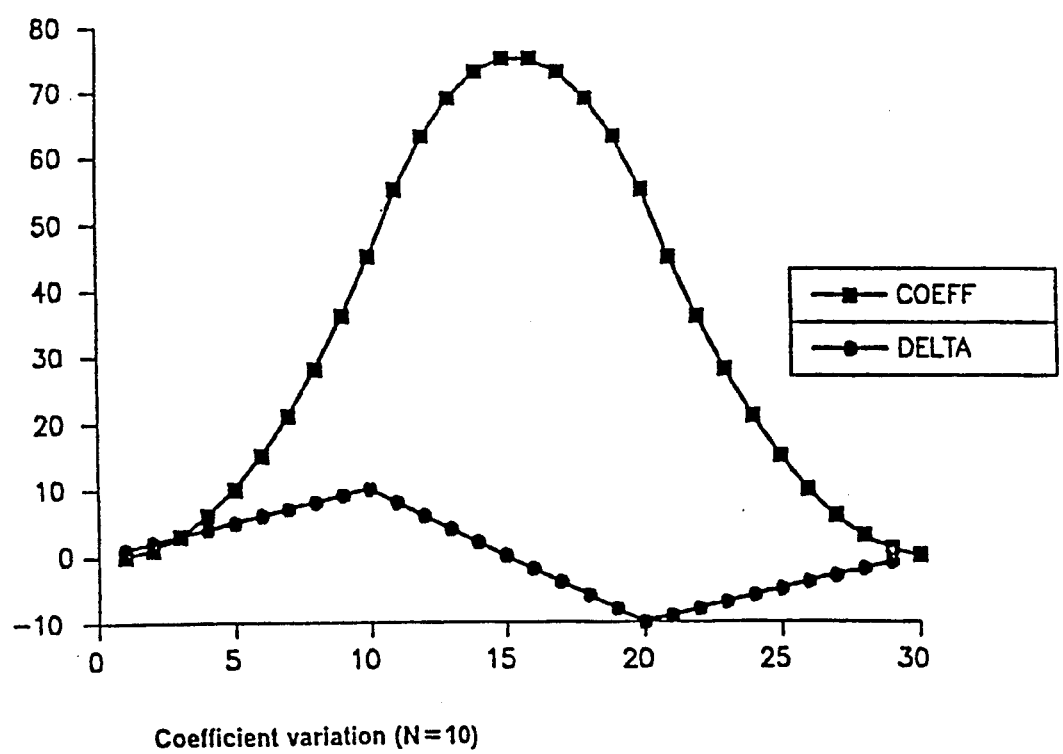
FIG. 4 illustrates the evolution of the coefficients of the filter included in the present invention for a decimation factor of N=10.

Therefore, it appears that the filtering coefficients can be divided in three distinctive groups which are characterized by important properieties: the first group (or first window w0) where the difference between 2 consecutive coefficients is incremented by one at every step from 1 to N; the second group (window w1) where the difference between 2 consecutive coefficients is decremented by two at every step from N to $2 \times N - 1$; a third group (window w2) where the difference between 2 consecutive coefficients is incremented by one at every step from $2 \times N$ to $3 \times N - 1$. It should be is absolutely independent of the value of the decimation factor N. FIG. 4 illustrates the variation of the coefficients of the filtering function involved in the decimation circuit according to the present invention.

Figure 5:
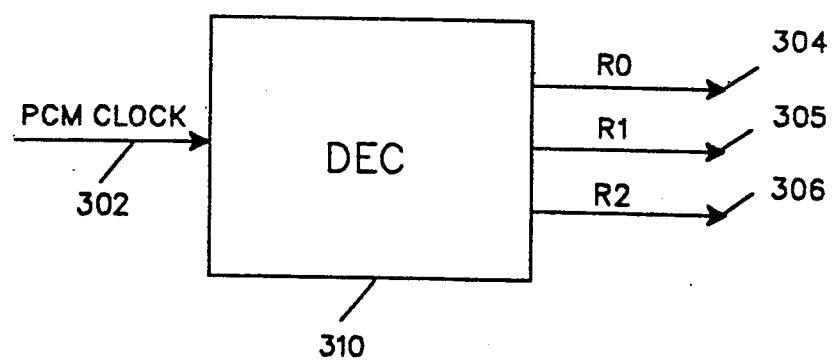
FIG. 5 illustrates the invention's decoding circuit 310 providing the required clocks.
Figure 6:
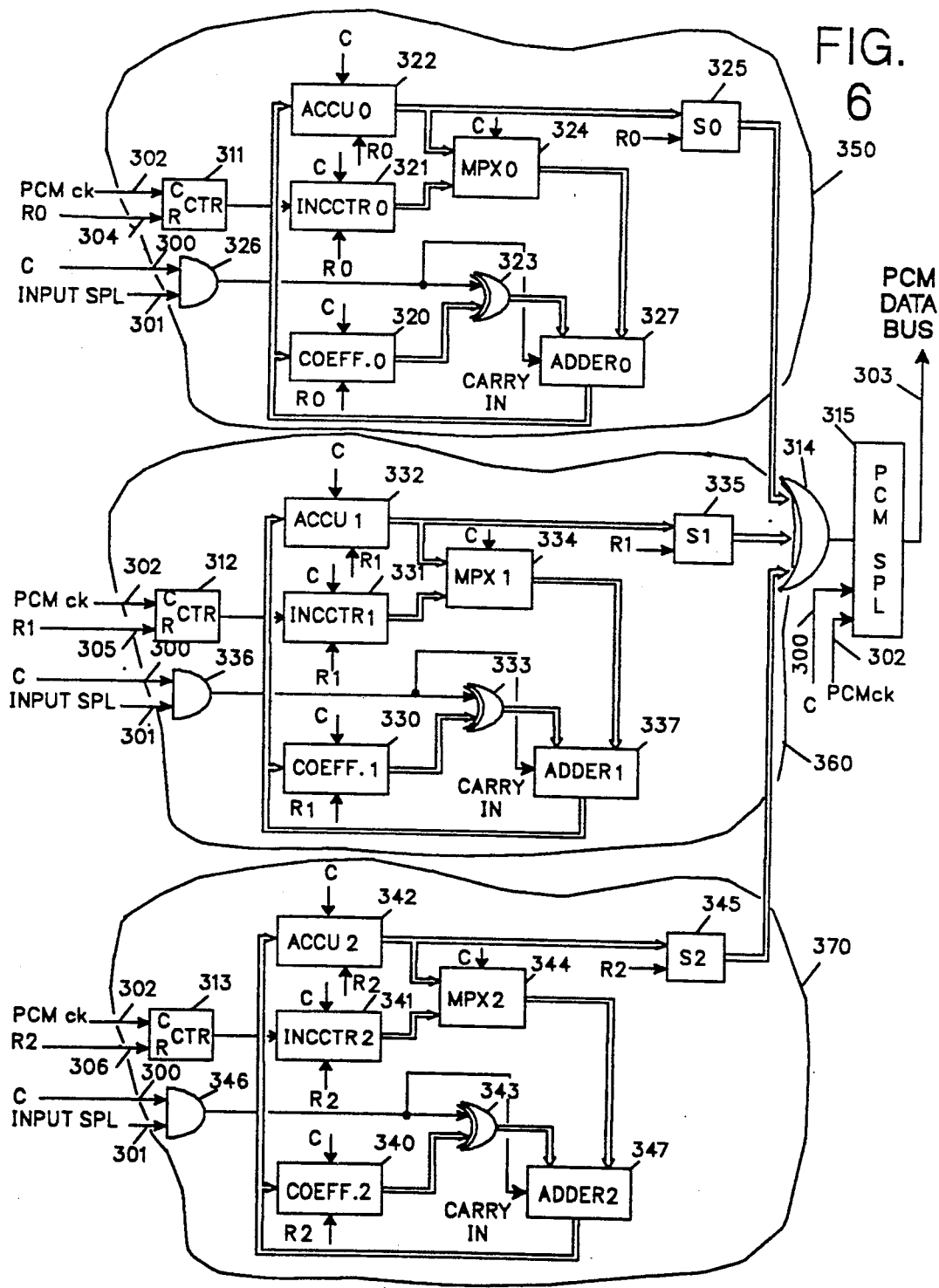
FIG. 6 shows the structure of a sigma-delta converter in accordance with the present invention.

FIGS. 5 and 6 shows the decimation circuit of the sigma-delta converter in accordance with the present invention which successively compute the values of the coefficients C(n) from the generation of the value DELTA(i) in accordance with the following relationship:

$$C(i+1) = C(i) + \text{DELTA}(i)$$

As will appear hereinafter, the computing of the coefficients by means of the generation of the sequence of parameters DELTA(i) provides any desired value of the decimation factor.

FIG. 6 is a detailed structure of the filtering and decimation device which receives a train of sigma-delta pulses on a INPUT SPL lead 301 and which converts it into PCM words on a PCM data bus 303. To achieve this, the device also receives the oversampling frequency clock fs (C) on a lead 300 and the PCM clock on a lead 302. The computation of one PCM sample is achieved by means of three separate calculations which are respectively performed by three corresponding computation blocks 350, 360 and 370, each computation block computing one PCM sample from a set of $3 \times N$ input samples received on lead 301. The computing blocks 350, 360 and 370 are respectively driven by a set of three phase-delayed clock R0, R1 and R2 which are generated by a decoding circuit 310 receiving the PCM clock on lead 302 as shown in FIG. 5. Decoding circuit 310 respectively generates the set of three phase-delayed clocks R0, R1, R2 on a set of three leads 304, 305 and 306 at a frequency of one third of the value of the frequency of the PCM clock as shown in FIGS. 7c, 7d, 7e and 7f. The use of the three computing blocks 350, 360 and 370 allows the whole generation of one PCM sample every N input samples S(i) which eventually provides a full down-sampling process with the desired decimation factor N.

The first computing block 350 includes a COEFF0 register 320 for storing the value of the coefficients C(n) which will be used in the filtering and decimation process, the latter register having an input bus connected to a corresponding output bus of an ADDER0 adding circuit 327. Block 350 further includes an ACCU0 accumulator 322 having an input bus connected to the output bus of ADDER0 adding circuit 327. As will be explained hereinafter, ADDER0 327 is alternatively used for computing the new calculated coefficient and also the partial PCM result: $C0 \times Si + C1 \times S(i+1) + C2 \times S(i+2) \ldots$ in accordance with relation 3 above. A counter 311 receives the PCM clock on lead 302 at its Clock input and also the R0 clock at its reset input existing on lead 304. Counter 311 generates a control signal for a INCCTR0 counter 321 which is used for continuously generating the values of DELTA(i). The update of the contents of counter 321 is performed either by an incrementation of one, or a decrementation of two according to the state of the output of counter 311. The output bus of INCCTR0 counter 321 is connected to a first input bus of a MPX0 multiplexing circuit 324 having a second input bus which is connected to the output bus of accumulator 322. MPX0 multiplexor 324 is controlled by the oversampling clock fs (c) on lead 300. MPX0 multiplexing circuit 324 has an output bus which is connected to a first input bus of an ADDER0 adding circuit 327, which circuit 327 having a second input bus connected to the output bus of a XOR circuit block 323. XOR circuit block 323 is a set of XOR circuits having each a first input connected to the output of a AND gate 326 and a second input connected to the corresponding lead of output bus of register 320. AND gate 326 has a first input which receives the oversampling clock fs (c) on lead 300 and a second input receiving the input sample of the train of sigma-delta pulses. The output of AND Gate 326 is also connected to the "Carry in" input of the ADDER0. The output of ACCU0 accumulator 322 is connected to the input of gates 325 which transmits the computed PCM sample every $3 \times N$ sigma-delta clock pulses at a first input of a set of OR gates 314. COEFF0 circuit 320, INCCTR0 counter 321, ACCU0 accumulator 322 and gates 325 receive the first R0 clock which is generated by decoding circuit 310 of FIG. 5. COEFF0 circuit 320, INCCTR0 counter 321 and ACCU0 accumulator also receives the oversampling clock c existing on lead 300.

Similarly, the second computing block 360 includes a COEFF1 register 330 for storing the value of the coefficients C(n) of the filtering/decimation process, the latter register having its inputs connected to the corresponding outputs of a ADDER1 adding circuit 337. Block 360 further includes an ACCU1 accumulator 332 having it input bus connected to the output bus of ADDER1 adding circuit 337. As will be described hereinafter, ADDER1 337 is alternatively used for computing the new calculated coefficient and also the result of the computed value $C0 \times Si + C1 \times S(i+1) + C2 \times S(i+2)$ in accordance with the relation (3) above. A counter 312 receives the PCM clock on lead 302 at its Clock input and also the R1 clock which exists on lead 305. Counter 312 generates a control signal for a INCCTR1 counter 331 which continuously generates the sequence DELTA(i) which will be needed to compute the coefficients of the second computing block 360. The update of counter 331 is performed either by an incrementation of one, or a decrementation of two according to the state of the output of counter 312. The output bus of INCCTR1 counter 331 is connected to a first input bus of a MPX1 multiplexing circuit 334 having a second input bus connected to the output bus of accumulator 332 and which is controlled by the oversampling clock fs (c) on lead 300. MPX1 multiplexing circuit 334 has an output bus which is connected to a first input bus of an ADDER1 adding circuit 337, which circuit 337 has a second input bus connected to the output bus of a XOR circuit block 333. XOR circuit block 333 is a set of XOR circuits having each a first input connected to the output of a AND gate 336 and a second input connected to the corresponding lead of the output bus of register 330. AND gate 336 has a first input which receives the oversampling clock fs (c) on lead 300 and a second input receiving the input sample coming from the sigma-delta converter. The output of AND gate 336 is also connected to the "Carry in" input of ADDER1. The output of ACCU1 accumulator 332 is connected to the input of gates 335 which outputs the PCM sample computed by block 360 every $3 \times N$ sigma-delta clock pulses and which is transmitted to a second input bus of set of OR gates 314. As for above, COEFF1 circuit 330, INCCTR1 counter 331, ACCU1 accumulator 332 and gates 335 receive the second R1 clock which is generated by decoding circuit 310 of FIG. 5. COEFF1 circuit 330, INCCTR1 counter 331 and ACCU1 accumulator also receives the oversampling clock fs (c) existing on lead 300.

Similarly to the above, the third computing block 370 includes a COEFF2 register 340 for storing the value of the coefficients C(n) needed for the filtering/decimation process of the third series of $3 \times N$ input samples which is processed by computing block 370. Register 340 has an input bus which is connected to the output bus of an ADDER2 adding circuit 347. Block 370 further includes an ACCU2 accumulator 342 having it input bus connected to the output bus of ADDER2 adding circuit 347. As will be described hereinafter, ADDER2 347 is alternatively used for computing the new calculated coefficient and also the result of the computed value $C0 \times Si + C1 \times S(i+1) + C2 \times S(i+2) \ldots$ in accordance with relation 3 above. A counter 313 receiving the PCM clock on lead 302 at its Clock input and also the R2 clock at its reset input existing on lead 306 generates a control signal for a INCCTR2 counter 341 which continuously generates the sequence of DELTA(i) needed to process the third set of $3 \times N$ input samples received by block 370. Similarly, for INCCTR0 and INCCTR1 counters, the update of delta in INCCTR2 block 341 is performed either by an incrementation of one, or a decrementation of two according to the state of the output line of counter 313. The output bus of INCCTR2 counter 341 is connected to a first input bus of a MPX2 multiplexing circuit 344 having a second input bus connected to the output bus of accumulator 342 and which is controlled by the c oversampling clock on lead 300. MPX0 multiplexing circuit 344 has an output bus which is connected to a first input bus of an ADDER2 adding circuit 347, which circuit 347 has a second input bus connected to the output bus of a XOR circuit block 343. XOR circuit block 343 is a set of XOR circuits having each a first input connected to the output of a AND gate 346 and a second input connected to the corresponding lead of the output bus of register 340. AND gate 346 has a first input which receives the oversampling clock fs (c) on lead 300 and a second input receiving the input sample coming from the sigma-delta converter. The output of AND gate 346 is connected to "Carry in" input of ADDER2. The output of ACCU2 accumulator 342 is connected to the input of gates 345 which outputs the desired PCM sample every $3 \times N$ sigma-delta clock period and which transmits it to a third input bus of a set of OR gates 314. Similarly than above, COEFF2 circuit 340, INCCTR2 counter 341, ACCU2 accumulator 342 and gates 345 receive the third R2 clock which is generated by decoding circuit 310 of FIG. 5. COEFF2 circuit 340, INCCTR2 counter 341 and ACCU2 accumulator also receives the oversampling clock fs (c) existing on lead 300.

The operation of the filtering/decimation circuit according to the present invention is as follows:

Considering the first computing block 350: at every clock period of the oversampling clock fs (c) existing on lead 300, counter 321 generates the following element of the sequence DELTA(i) illustrated in FIG. 4 by means of either an incrementation of one or a decrementation of two according to the state of the output of counter 311. Then, the update of the coefficient c(n) is performed in register 320.

To achieve this, during the first half of the oversampling clock period fs (c)—i.e. when the fs clock on lead 300 is at its low level—MPX0 multiplexing circuit 324 transmits the value DELTA(i) carried by the output bus of INCCTR0 counter 321 to the first input bus of ADDER2 circuit 327. The second input bus of ADDER0 circuit 327 receives the contents of COEFF0 register 320 via XOR 323 because the output of AND gate 326 is set to a low level since the oversampling clock fs (c) on lead 300 is also at a low level. Similarly the input Carry in of ADDER0 is at a low level. ADDER0 circuit 327 therefore performs the computation: $c(n) = c(n-1) + \text{DELTA}(n-1)$ and the result c(n) is stored into COEFF0 register 320 at the rising edge of the sigma-delta clock period, that is to say at the end of the first half of the sigma-delta clock period.

During the second half of the oversampling clock period—i.e., when the latter clock is at a high level—, MPX0 multiplexing circuit 324 transmits the contents of ACCU0 accumulator 322 to the first input bus of ADDER0 adding circuit 327 while its second input bus receives the output of XOR gates 323. XOR gates 323 transmits to ADDER0 adding circuit 327 the contents of COEFF0 register 320 or its inverse according to the value of the input sample SPL which is existing on lead 301 during the second half of the oversampling clock period. In the same time, the value of the input sample SPL is presented to ADDER0 Carry in input through AND gate 326. This provides a very simple way to achieve the computation of the term referred to in relation 2 above.

Therefore, during that second half of the sigma-delta clock period, the input sigma-delta sample S(i+n) on lead 301 is multiplied by the value of the coefficient C(n) stored in register 320 and the result $C(n) \times S(i+n)$ is added to the contents of ACCU0 accumulator 322 by ADDER0 adding circuit 327. The result of the latter addition, i.e., the partial computation of the PCM sample $C(0) \times S(i) + C(1) \times S(i+1) + C(2) \times S(i+2) \ldots$ is loaded into ACCU0 accumulator 322 on the falling edge of the oversampling clock fs, i.e. at the end of the second half of the clock period of the sigma-delta clock fs.

INCCTR0 counter 321 is used to continuously generate the sequence DELTA(i) which is needed in the computation of the PCM sample by control block 350 and is controlled by counter 311 as follows: when the output of counter 311 is set to a low level, INCCTR0 counter 321 is incremented by one when the oversampling clock fs (c) on lead 300 switches to a high level. Conversely, when the output of counter 311 is set to a high level, INCCTR0 counter 321 is decremented by two on the rising edge of the oversampling clock period on lead 300. The structure of INCCTR0 counter 321 is well known to the skilled man and will not be detailed. Therefore, INCCTR0 counter 321 stores at every clock period, and more accurately at every half of the oversampling clock period when the latter switches to a high level, the value of DELTA which will be used to update the value of the coefficient needed to compute the PCM sample in accordance with the relation C(n)=C(n−1)+DELTA(n−1). The latter update of the value of the coefficient C(n) occurs during the first half of the next clock period.

R0 clock generated by decoding circuit 310 of FIG. 5 is used to reset the different registers and counters: COEFF0 register 320, INCCTR0 counter 321, and counter 311 are reset when the R0 clock on lead 304 switches to a high level. Conversely, ACCU0 accumulator 322 is reset when the latter R0 clock switches to a low level. Moreover, counter 311 switches at every rising edge of the PCM clock on lead 302. Therefore, when the R0 clock on lead 304 switches to a high level, counter 311 is reset and its output is set to a low level: the INCCTR counter 321 is then incremented by one during a set of N oversampling clock period. At the next PCM pulse on lead 302, the output of counter 311 switches to a high level and INCCTR0 counter 321 is decremented by two during a set of N oversampling clock period. Similarly, at the next pulse of the PCM clock on lead 302, the output of counter 311 switches again to a low level and INCCTR0 counter 321 is incremented again by one during a set of N oversampling clock period. It appears that the contents of INCCTR0 counter 321 fully conforms to the diagram of FIG. 4 illustrating the variation of the value of delta(i). Therefore, at the end of 3×N consecutive oversampling clock periods, the ACCU0 accumulator 322 is loaded with the value of one PCM sample derived from the sigma-delta pulses according to the formula:

$$\sum_{n=0}^{3N-1} C_n S_{i+n}$$

The PCM sample is transmitted to the output of gates 325 at every pulse of the R0 clock and received at the first input of OR gates 314. Since a number of 3×N input samples have been required to generate the PCM output sample which was computed by block 350, the PCM samples generated by block 350 appear at a frequency of fs/3N. Computing blocks 360 and 370 operate similarly to computing block 350 but are only phase-delayed since block 360 (resp. block 370) is driven by the phase-delayed R1 clock (resp. R2 clock) which is generated by decoding circuit 310 on lead 305. (resp. 306). Briefly, computing block 360 (resp. 370) operates as follows: at every clock period of the oversampling clock fs (c) existing on lead 300, counter 331 (respectively 341) computes the new value of DELTA under control of counter 312 (resp. 313). For this, during the first half of the oversampling clock period fs (c), MPX1 multiplexing circuit 334 (resp. MPX2 multiplexing circuit 344) transmits the value DELTA(n−1) at the output of INCCTR1 counter 331 (resp. 341) to the first input bus of ADDER1 337 (resp. ADDER2 347).

The second input bus of ADDER1 337 (resp. ADDER2 347) receives the contents C(n−1) of COEFF1 register 330 (resp. COEFF2 register 340) via XOR 333 (resp. 343) because the output of AND gate 336 (resp. 346) is set to a low level. Similarly, "Carry in" input of ADDER1 (resp. ADDER2) is at a low level. ADDER1 circuit 337 (resp. ADDER2 circuit 347) performs the computation c(n)=c(n−1)+DELTA(n−1).

The result of the latter computation is stored again into COEFF1 register 330 (resp. COEFF2 register 340) on the rising edge of the oversampling clock period fs (c), i.e., at the end of the first half of that clock period. As above, during the second half of the clock period, MPX1 multiplexing circuit 334 (resp. MPX2 multiplexing circuit 344) transmits the contents of ACCU1 accumulator 332 (resp. ACCU2 342)—carrying the partial result of the PCM sample computation C(0)×S(i+1)+C(1)×S(i+2)+C(2)×S(i+3)+. . . (resp. C(0)×S(i+2)+C(1)×S(i+3)+C(2)×S(i+4)+. . . )—to the first input bus of ADDER1 circuit 337 (resp. ADDER2 347) while its second input bus receives the output of XOR gates 333 (resp. XOR 343). In the same time, the value of the input sample SPL is presented to ADDER1 (resp. ADDER2) "Carry in" input through AND gate 336 (resp. 346). Therefore, during the second half of the sigma-delta clock period, the input sigma-delta sample S(i+n) on lead 301 is multiplied by the value of the coefficient C(n) which has been computed before and stored into register 330 (resp. register 340). The product C(n)×S(i+n) is added to the contents of ACCU1 accumulator 332 (resp. ACCU2 accumulator 342) by ADDER1 circuit 337 (resp. ADDER2 circuit 347). The result of the latter addition, corresponding to the partial result of the PCM sample computed by block 360 (resp. 370), is loaded into ACCU1 accumulator 332 (resp. ACCU2 accumulator 342) on the falling edge of the oversampling clock fs (c), i.e., at the end of the second half of the clock period. INCCTRI counter 331 (resp.

INCCTR2 counter 341) is used to continuously generate the sequence DELTA(n) needed to compute the coefficients C(n) is controlled by counter 312 (resp. counter 313) as follows: when the output of counter 312 (resp. 313) is set to a low level, INCCTR1 counter 331 (resp. INCCTR2 counter 341) is incremented by one on the rising edge of the oversampling clock. Conversely, when the output of counter 312 (resp. 313) is set to a high level, INCCTR1 counter 331 (resp. INCCTR2 counter 341) is decremented by two on the rising edge of the oversampling clock on lead 300. Therefore, INCCTR1 counter 331 (resp. INCCTR2 counter 341) stores on every rising edge of the oversampling clock the value of DELTA(n) which will be used to compute the new coefficient C(n).

As above, the latter update of the value of the coefficient C(i) will occur during the first half of the next clock period. R1 (resp. R2) clock generated by decoding circuit 310 of FIG. 5 is used to reset the different registers and counters: COEFF1 register 330, INCCTR1 counter 331 and counter 312 (resp. COEFF2 register 340, INCCTR2 counter 341 and counter 313) are reset at the rising edge of the R1 clock (resp. R2). On the other hand, ACCU1 accumulator 332 (resp. ACCU2 accumulator 342) is reset on the falling edge of the R1 clock (resp. R2 clock). Moreover, counter 312 (resp. 313) switches at every rising edge of the PCM clock on lead 302. Therefore, when the R1 clock (resp. R2 clock) switches to a high level, counter 312 (resp. 313) is reset and its output is low: the INCCTR1 counter 331 (resp. INCCTR2 counter 341) is then incremented by one during a set of N oversampling clock period. At the next PCM pulse, the output of counter 312 (resp. 313) switches and INCCTR1 counter 331 (resp. INCCTR2 counter 341) is decremented by two during a following set of N oversampling clock periods, etc . . . Therefore, at the end of $3 \times N$ consecutive oversampling clock periods, a PCM pulse is available in ACCU1 accumulator 332 (resp. ACCU2 accumulator 342). The latter PCM sample is transmitted to the second (resp. third) input of OR gate 314 by means of gates 335 (resp. 345) which are controlled by R1 clock (resp. R2 clock).

As a conclusion, the set of three computing block 350, 360 and 370, each generating one PCM sample every $3 \times N$ input sample which is transmitting to one input of OR gate 314, produces a train of PCM samples at a frequency of fs/N. The output of OR gate 314 is connected to the input of a register 315 which provides the PCM word on a PCM data bus 303 at the desired fs/N frequency.

Figure 7:
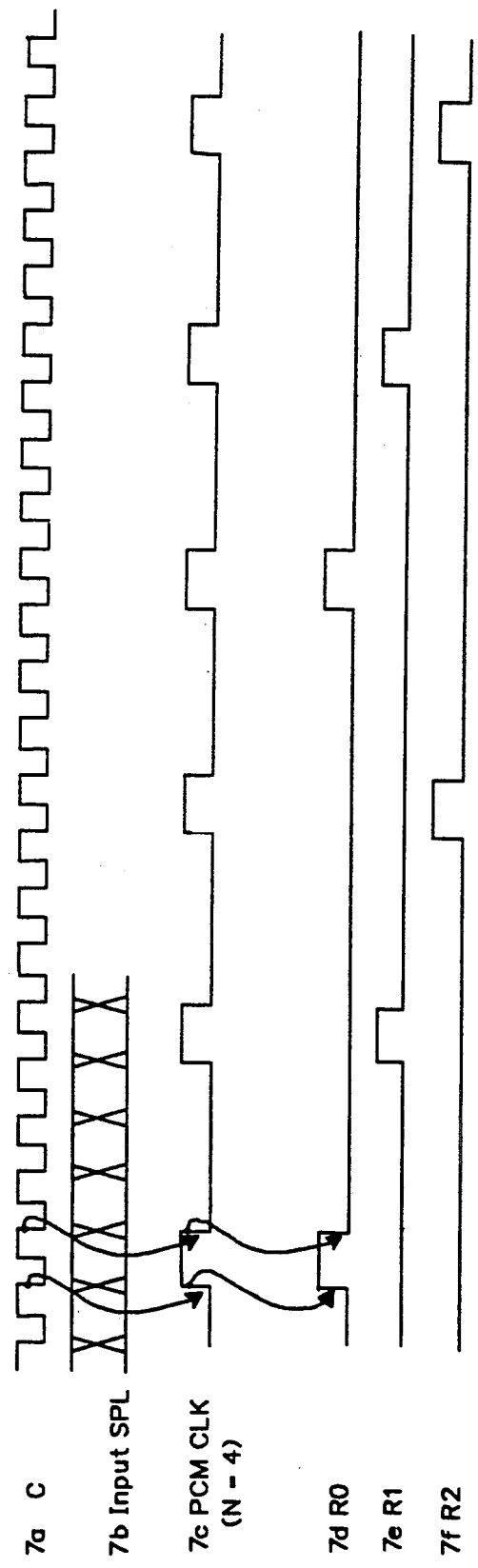
FIG. 7 are timing diagrams illustrating the operation of the invention.

FIG. 7 particularly illustrates the preceding operation by showing different timing diagrams which are involved in the filtering and decimation process when the decimation factor is equal to 4. There is also illustrated the continuous update process of INCCTR0 counter 321, COEFF0 register 320, INCCTR1 counter 331, COEFF1 register 330, INCCTR2 counter 341, and COEFF2 register 340. It clearly appears that the operations of each computing block 350, 360 or 370 are similar, but phase-delayed.

Therefore, the decimation process can be easily preset and adjusted to predetermined parameters, i.e., the over-sampling rate and the decimation factor can be easily adjusted in a wide range in order to reach the necessary resolution for the PCM signal. It should be noticed that the filtering and decimation process operates regardless of the value of the decimation factor. This is simply achieved by using registers, adders, multiplexing circuits and accumulators having the appropriate size with respect to higher values of the decimation factor which is desired. For instance, if the higher decimation factor which is desired is equal to N, the registers, adders, multiplexing circuits and accumulators should respectively be able to control $N^3$ values. The number of bits must be chosen accordingly. The set of computing blocks 350, 360 and 370 only requires the provision of the oversampling clock on lead 300, the train of sigma-delta pulses on lead 301 and the PCM clock on lead 302 which accurately indicates the instants when the PCM word resulting from the decimation process has to be delivered. The filtering and decimation device according to the present invention is particularly suited for a wide variety of different applications. Moreover, the adjustment of the decimation factor can be easily achieved only by adjusting the clocks which are entered into the coder.

Figure 8B:
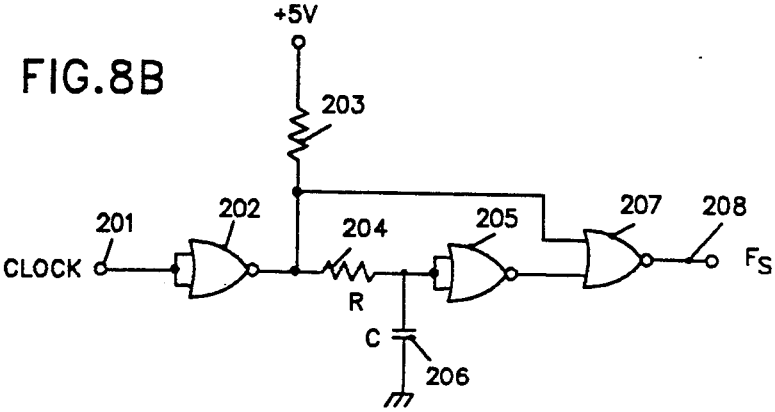
FIGS. 8a and 8b show the structure of a double-loop sigma-delta converter which can be used with the decimation filter according to the present invention in order to carry out an efficient and simple analog-to-digital converter.
Figure 8A:
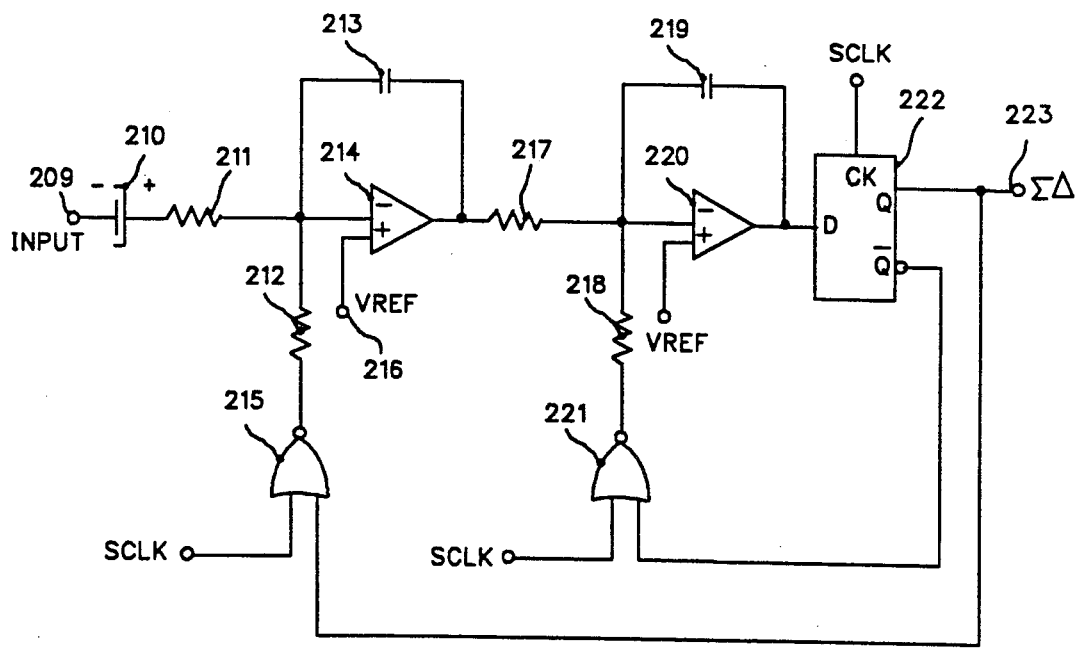

A sigma-delta converter 101 which is particularly adapted to the filtering and decimation device according to the present invention is a first order or second-order converter such as shown in FIGS. 8a and 8b.

FIG. 8A illustrates an example of a double-loop sigma-delta converter according to the present invention which is embodied with discrete, off-the-shelf analog components and which provides an actual signal-to-noise ratio close to its theoretical ratio, and also close to that provided by the corresponding sigma-delta converter embodied in an integrated circuit using the switched capacitor technique. With respect to FIG. 8A, the DC component of the analog signal to be converted is suppressed by means of a capacitor 210. The resulting signal is transmitted to a first lead of a resistor 211 having a second lead respectively connected to the inverting input of an operational amplifier (OA) 214, to a first lead of a resistor 212 and to a first lead of a capacitor 213. The output of the latter operational amplifier is connected to a second lead of capacitor 213 and to a first lead of a resistor 217 having a second lead respectively connected to the inverting input of a second operational amplifier 220, to a first lead of a resistor 218 and to a first lead of a capacitor 219. Operational amplifier 220 has its output lead connected to a second lead of capacitor 219 and to the D-input lead of a D-type latch 222 used as a threshold device. Latch 222, being a latch of the type 7474 well known in the art, provides at its output leads a sequence of voltages being either equal to 5 Volts (or Vcc more generally) or 0 Volts at the rhythm of a fs clock existing at its CK input lead. A example of a circuit for generating the latter fs clock will be described hereinafter with reference to FIG. 8B. A reference potential Vref being equal to half the value of the positive supply voltage of latch 222 is transmitted to the non invert input of operational amplifiers 214 and 220 via a lead 216. The non-inverted Q output lead 223 of latch 222 is connected to a first input of a NOR gate 215 of the type 7402, well known by the skilled man, and having its second input lead receiving the fs clock and also an output lead connected to a second lead of resistor 212. The inverted output lead of latch 222 is connected to a first input of a NOR gate 221 which has its second input lead receiving the fs clock and also an output lead connected to a second lead of resistor 218.

Figure 2A:
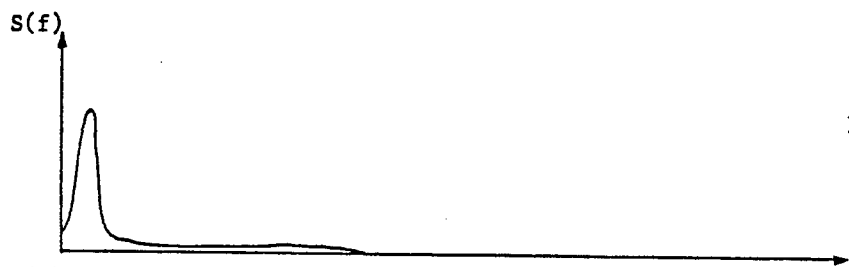
FIGS. 2a-2e show illustrative signal spectra which are involved in the sigma-delta and decimation process.
Figure 2B:
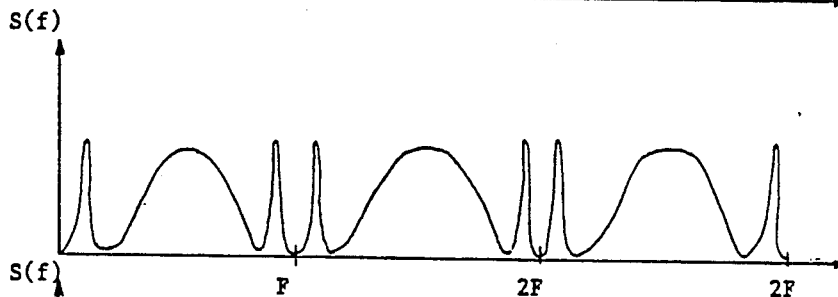
Figure 2C:
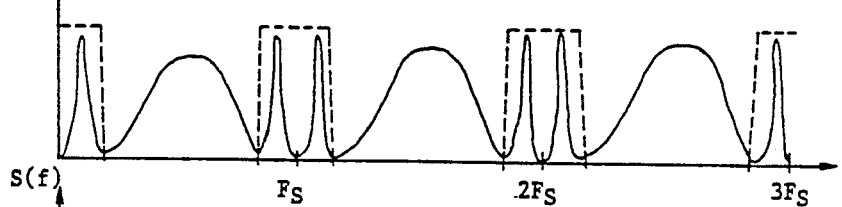
Figure 2D:
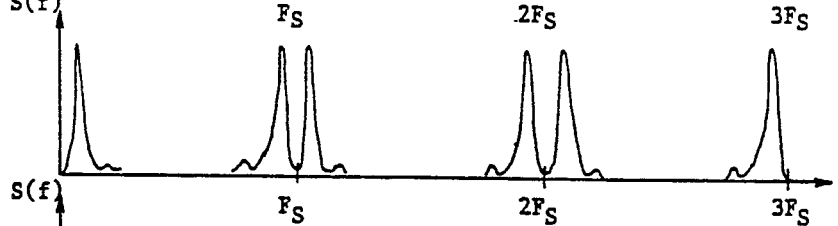
Figure 2E:
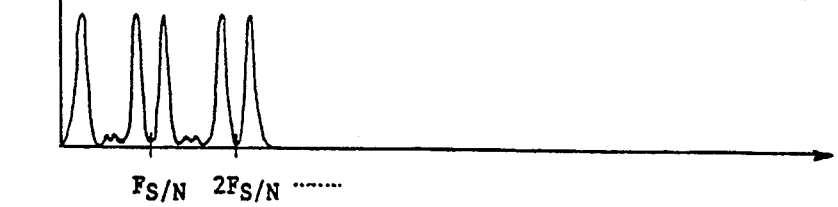

It appears that the feedback signal appearing at the output of NOR 215 is added to the analog input AC voltage to be converted and then integrated by means of the circuit formed by OA 214, resistors 211 and 212 and capacitor 213. Similarly, the feedback signal appearing at the output of NOR 221 is added to the signal at the output of OA 214 and integrated by means of the circuit based on OA 220, resistors 217 and 218, and capacitor 219. Thus the circuit of FIG. 2A has a double feedback loop similar to that of the architecture shown with respect to FIG. 1. The output Q of latch 222 provides a train of sigma-delta pulses which can be used to drive the decimation filter which has been described above.

The FIG. 8B shows a preferred embodiment of the fs sigma/delta clock generator in accordance with the preferred embodiment of the invention. A NOR gate 202, connected as an inverter, has its two input leads receiving a squared wave clock signal having the desired sigma-delta frequency. The output of NOR 202 is connected to a first lead of a resistor R 204, to a first lead of a resistor 203 having its second lead connected to the voltage supply (5 Volts in the preferred embodiment), and to a first input of a NOR gate 207. Resistor R 204 has a second input which is connected to a first input of a capacitor C 206 having a second lead connected to ground, and to the two input leads of a NOR gate 205, the output of which being connected to a second input of NOR 207. The output of NOR 207 eventually provides on a lead 208 the required fs clock. NOR gate 202 is used as an inverter and permits to supply enough current to drive the electronic components being connected.

FIGS. 9A, 9B and 9C respectively show timing diagrams of the voltages existing on leads 208, 223 and 215. As illustrated in the figures, fs clock appears to be a train of pulses at the oversampling frequency, the pulses being very short and largely exaggerated in FIG. 3A. That train of pulses respectively transmitted to one input of NOR gates 215 and 221 in both feedback loops of the sigma-delta converter causes a return-to-zero of the output voltage of NOR 215 and NOR gate 221 at every raising edge of the fs clock. In this way, two adjacent "1"s ("ONE") in the train of sigma-delta pulse on lead 223 causes the appearance of two pulses at the output of NOR 215. Therefore, the "weight" of two adjacent "1"s will be exactly twice the "weight" of one "1", which was not the case in the conventional sigma-delta converter because of the asymmetry of the rise time and fall time of the converter. The linearity of the converter and its actual signal-to-noise ratio are substantially improved and reaches those obtained by integrated sigma-delta converters which traditionally use the switched capacitor technique. The fs clock introduced in both feedback loops by means of NOR gates 215 and 216 entails the appearance in the sigma-delta code of a DC component proportional to the pulse width of fs clock. The latter DC component will be easily suppressed by traditional digital handling methods well known by the skilled man or still, by choosing appropriate values of resistor 204 and capacitor 206, so that R×C becomes negligible relative to the full period of the fs clock.

It should be noticed that the man skilled in the art will easily and straight forwardly embody the invention with a circuit in the feedback loops which generates a return-to-one at every raising edge of the fs clock.

It can be advantageous in some cases to choose a R×C value leading to a non-negligible pulse width in the fs clock. It has been discovered that if the latter width is not negligible the sigma-delta converter introduces an amplification step in the conversion process, the amplification being determined by the width of every pulse in fs clock. The width can be controlled by means of an adjustable resistor 204 or still by means of a digital circuit providing numerous clocks having the desired duty cycle form and associated with a switch (not shown) for selecting the appropriate clock. In the preferred embodiment of the invention, the sigma-delta converter is not associated with an amplification step. For that purpose, resistance R and capacitor C are chosen so that the product R×C is negligible with respect to the full period of the fs clock, according to the technology used.

However, it should be noticed that the filtering and decimation device according to the present invention is not limited to the sigma-delta technology and could be used in any apparatus requiring a decimation and filtering process in accordance with relation 1 with a variable decimation factor, such as for instance spectrum analyzing devices having Fast Fourier Transformation (FFT) zoom capabilities.

We claim:

1. Decimation filter for converting a train of sigma-delta sample pulses S(i) in synchronism with a sigma-delta clock (fs) into a train of Pulse Code Modulation (PCM) samples in accordance with the formula $$\sum_{n=0}^{3N-1} C_n S_{i+n}$$

where Cn is the sequence of the coefficients of the decimation filter which corresponds to a determined decimation factor N, characterized in that it includes: computing means (350, 360, 370) further including:

counting means (321, 331, 341) driven by said sigma-delta clock (fs) and which is continuously incremented by one during N sigma-delta clock pulses, then decremented by two during N following sigma-delta clock pulses and then incremented again by one during N following sigma-delta clock pulses for generating a incrementation parameter (DELTA(n)), storing means (320, 330, 340) for storing the value of the coefficient C(n) of said decimation filter to be multiplied by the next input sample S(i+n) to be processed, means (327, 337, 347) active every sigma-delta clock period for incrementing said storing means (320, 330, 340) with said incrementation parameter (DELTA(n)), means (323, 327) for deriving from the contents C(n) of said storing means (320, 330, 340) and from the train of input sigma-delta samples S(i+n) one Pulse Code Modulation (PCM) sample every 3×N input sigma-delta samples.

2. Filtering and decimation device according to claim 1 characterized in that:

it includes three computing means (350, 360, 370) respectively driven by a set of three phase-delayed clocks derived from said sigma-delta clock (fs), each of said computing means (350, 360, 370) computing one PCM sample from a sequence of 3×N consecutive input sigma-delta pulses.

3. Filtering and decimation device according to claim 1 or 2 characterized in that:

said counting means (321, 331, 341) has a control lead and performing a incrementation by one when said control lead is at a first logical level and conversely for performing a decrementation by two when said control lead is at a second logical level, and that each of said three computing means (350, 360, 370) includes:

a first register (320, 330, 340) for storing the value C(n) of the coefficient to be multiplied by the next sigma-delta input sample S(i+n), adding means (327, 337, 347) active every sigma-delta clock period for adding the contents of said counting means with the contents of said first register (320, 330, 340) in order to compute the following coefficient C(n+1) to be loaded into said first register (320, 330, 340).

4. Filtering and decimation device according to claim 3 characterized in that each of said three computing means (350, 360, 370) further includes multiplying means (323, 333, 343) connected to said first register (320, 330, 340) and receiving said train of sigma-delta pulses for computing at every period of the sigma-delta clock (fs) the product $C(n) \times S(i+n)$, a second register (322, 332, 342) continuously incremented by the result of said multiplying means.

5. Filtering and decimation device according to claim 4 characterized in that in each of said three computing means (350, 360, 370), said adding means (327, 337, 347) is also used for computing the new coefficient $C(n+1)$ stored into said first register (320, 330, 340) and for incrementing said second register (322, 332, 342).

6. Filtering and decimation device according to claim 5 characterized in that each of said three computing means (350, 360, 370) further includes multiplexing means (324, 334, 344) having a first input bus connected to the output bus of said second register (322, 332, 342) and a second input bus connected to the output of said counting means (321, 331, 341), said multiplexing means being controlled by said sigma-delta clock, XOR gating means (323, 333, 343) having one input connected to the output of a AND gate (326, 336, 346) receiving the input train of sigma-delta pulses and also the sigma-delta clock, said XOR gating means (323, 333, 343) having a second input bus connected to the output bus of said first register (320, 330, 340), and that said adding means (327, 337, 347) has a first input bus connected to the output of said multiplexing means and a second input bus connected to the output of said XOR gating means (323, 333, 343), the output bus of said adding means being connected to the input of said first and said second register, whereby said adding means performs the computation of $c(n)+\text{DELTA}(i)$ during one half of said sigma-delta clock period and the update of said second register during the second half of said sigma-delta clock period.

7. An analog-to-digital converter including a sigma-delta converter and further characterized in that said sigma-delta converter includes:

a threshold device (222) for generating an output and feedback signal, a filter (214, 220) receiving the analog input signal to be converted and said output and feedback signal by means of at least one feedback loop, means (215, 221) located in said at least one feedback loop for performing a return-to-specified-logical-state of the sigma-delta code generated by said threshold device at every period of the sigma-delta clock thereby making the sigma-delta converter insensitive to the rise and fall time of the threshold device.

8. Analog-to-digital converter according to claim 7 characterized in that said sigma-delta converter further includes:

a first integrator (214, 213, 211, 212) receiving said analog input signal to be converted and a first feedback signal coming from a first feedback loop, a second integrator (220, 217, 218, 219) receiving the analog output of said first integrator and a second feedback signal coming from a second feedback loop and having an output lead connected to said threshold device, first means (215, 208) for performing a return-to-zero of the feedback signal conveyed through said first feedback loop to said first integrator, second means (221, 208) for performing a return-to-zero of the feedback signal conveyed through said second feedback loop to said second integrator.

* * * * *